(12) United States Patent
Takayama et al.

(10) Patent No.: US 7,843,984 B2
(45) Date of Patent: Nov. 30, 2010

(54) SEMICONDUCTOR LASER DEVICE

(75) Inventors: Toru Takayama, Hyogo (JP); Hiroki Nagai, Hyogo (JP); Hitoshi Sato, Okayama (JP); Tomoya Satoh, Osaka (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 4 days.

(21) Appl. No.: 12/392,452

(22) Filed: Feb. 25, 2009

(65) Prior Publication Data

US 2009/0285254 A1 Nov. 19, 2009

(30) Foreign Application Priority Data

May 15, 2008 (JP) .............................. 2008-128556

(51) Int. Cl.
*H01S 3/04* (2006.01)
*H01S 5/00* (2006.01)

(52) U.S. Cl. ............................... 372/50.12; 372/50.121; 372/43.01

(58) Field of Classification Search ............ 372/50.121, 372/43.01, 50.12, 50.122, 68
See application file for complete search history.

(56) References Cited

U.S. PATENT DOCUMENTS 7,260,132 B2 * 8/2007 Nishida et al. ............ 372/50.12

2007/0025406 A1 * 2/2007 Yamada et al. ......... 372/50.121

FOREIGN PATENT DOCUMENTS

JP 11-186651 7/1999
JP 2002-190649 7/2002

* cited by examiner

*Primary Examiner*—Minsun Harvey
*Assistant Examiner*—Patrick Stafford
(74) *Attorney, Agent, or Firm*—McDermott Will & Emery LLP (57) ABSTRACT

A semiconductor laser device has a red laser element and an infrared laser element on a substrate. The red laser element has a double hetero structure in which an InGaP-based or AlGaInP-based active layer is interposed between a first conductivity type cladding layer and a second conductivity type cladding layer having a ridge. The infrared laser element has a double hetero structure in which a GaAs-based or AlGaAs-based active layer is interposed between a first conductivity type cladding layer and a second conductivity type cladding layer having a ridge. Provided that a first electrode formed over the second conductivity type cladding layer has a width W1 in a direction perpendicular to a cavity length direction and a second electrode formed over the second conductivity type cladding layer has a width W2 in a direction perpendicular to a cavity length direction, the relations of W1>W2 and 80 μm≧W2≧60 μm are satisfied.

3 Claims, 8 Drawing Sheets

FIG.8A
RED LASER

FIG.8B
INFRARED LASER

SEMICONDUCTOR LASER DEVICE

CROSS-REFERENCE TO RELATED APPLICATIONS

This application claims priority under 35 U.S.C. §119(a) on Japanese Patent Application No. 2008-128556 filed on May 15, 2008, the entire contents of which are hereby incorporated by reference.

BACKGROUND

High-capacity digital versatile discs (DVDs) capable of recording at a high density and DVD devices for playing such DVDs have been commercialized and have attracted attention as products of growing demand. Due to the high density recording of the DVDs, an AlGaInP (aluminum gallium indium phosphide)-based semiconductor laser device having an emission wavelength of 650 nm is used as a laser light source for recording and playing the DVDs. Accordingly, an optical pickup of a conventional DVD device can neither record nor play recordable compact discs (CDRs) which are recorded and played by using an AlGaAs (aluminum gallium arsenide)-based semiconductor laser having an emission wavelength of 780 nm.

An optical pickup having lasers of two wavelengths mounted therein has therefore been employed. In this optical pickup, a 650 nm-band AlGaInP-based semiconductor laser (a red laser) and a 780 nm-band AlGaAs-based semiconductor laser (an infrared laser) are mounted as a laser chip in separate packages. A device capable of recording and playing both DVDs and CDRs has thus been implemented.

Such an optical pickup, however, has a large size because two separate packages of the AlGaInP-based semiconductor laser and the AlGaAs-based semiconductor laser are mounted. Accordingly, the size of a DVD device using such an optical pickup is increased.

In view of this problem, an integrated semiconductor light emitting device integrating a plurality of kinds of semiconductor light emitting elements is known in the art. In this integrated semiconductor light emitting device, the plurality of kinds of semiconductor light emitting elements have different emission wavelengths from each other, and the light emitting element structure of each semiconductor light emitting element is formed by semiconductor layers grown on the same substrate. An example of such an integrated semiconductor light emitting device is described in Japanese Patent Laid-Open Publication No. H11-186651 (hereinafter, referred to as Document 1).

Figure 9:
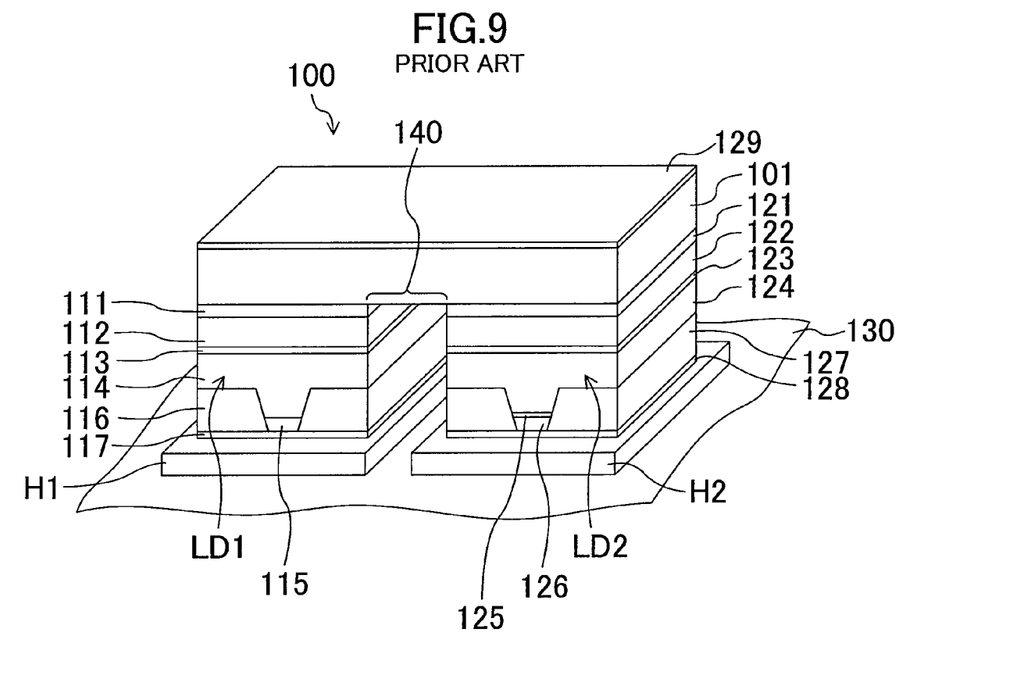
FIG. 9 shows an example of a two-wavelength semiconductor laser of related art.

FIG. 9 shows an example of the integrated semiconductor light emitting device described in Document 1. As shown in FIG. 9, in a conventional integrated semiconductor laser device 100, a 700 nm-band (e.g., 780 nm) AlGaAs-based semiconductor laser LD1 and a 600 nm-band (e.g., 650 nm) AlGaInP-based semiconductor laser LD2 are integrated in a separated state on the same n-type GaAs (gallium arsenide) substrate 101.

For example, a substrate having a (100) orientation or a substrate having a surface tilted at, for example, 5° to 15° from a (100) face as a main surface is used as the n-type GaAs substrate 101.

In the AlGaAs-based semiconductor laser LD1, an n-type GaAs buffer layer 111, an n-type AlGaAs cladding layer 112, an active layer 113 having a single quantum well (SQW) structure or a multiple quantum well (MQW) structure, a p-type AlGaAs cladding layer 114, and a p-type GaAs cap layer 115 are sequentially formed in this order on the n-type GaAs substrate 101.

An upper part of the p-type AlGaAs cladding layer 114 and the p-type GaAs cap layer 115 form a stripe shape extending in one direction. An n-type GaAs current confinement layer 116 is formed on both sides of the stripe portion, whereby a current confinement structure is formed. A p-side electrode 117 is provided on the stripe-shaped p-type GaAs cap layer 115 and the n-type GaAs current confinement layer 116 and has ohmic contact with the p-type GaAs cap layer 115. For example, a Ti/Pt/Au (titanium/platinum/gold) electrode is used as the p-side electrode 117.

In the AlGaInP-based semiconductor laser LD2, an n-type GaAs buffer layer 121, an n-type AlGaInP cladding layer 122, an active layer 123 having an SQW structure or an MQW structure, a p-type AlGaInP cladding layer 124, a p-type GaInP (gallium indium phosphide) intermediate layer 125, and a p-type GaAs cap layer 126 are sequentially formed in this order on the n-type GaAs substrate 101.

An upper part of the p-type AlGaInP cladding layer 124, the p-type GaInP intermediate layer 125, and the p-type GaAs cap layer 126 form a stripe shape extending in one direction. An n-type GaAs current confinement layer 127 is formed on both sides of the stripe portion, whereby a current confinement structure is formed. A p-side electrode 128 is provided on the stripe-shaped p-type GaAs cap layer 126 and the n-type GaAs current confinement layer 127 and has ohmic contact with the p-type GaAs cap layer 126. For example, a Ti/Pt/Au electrode is used as the p-side electrode 128.

An n-side electrode 129 is provided on the back surface of the n-type GaAs substrate 101 and has ohmic contact with the n-type GaAs substrate 101. For example, an AuGe/Ni (gold-germanium/nickel) electrode or an In (indium) electrode is used as the n-side electrode 129.

The p-side electrode 117 of the AlGaAs-based semiconductor laser LD1 and the p-side electrode 128 of the AlGaInP-based semiconductor laser LD2 are respectively soldered on a heat sink H1 and a heat sink H2 by AuSn (gold-tin) or the like. The heat sink H1 and the heat sink H2 are provided on a package base so as to be electrically isolated from each other.

In the conventional integrated semiconductor laser device 100 described above, the AlGaAs-based semiconductor laser LD1 can be driven by applying a current between the p-side electrode 117 and the n-side electrode 129. The AlGaInP-based semiconductor laser LD2 can be driven by applying a current between the p-side electrode 128 and the n-side electrode 129. Laser light of a 700 nm band (e.g., 780 nm) can be obtained by driving the AlGaAs-based semiconductor laser LD1, and laser light of a 600 nm band (e.g., 650 nm) can be obtained by driving the AlGaInP-based semiconductor laser LD2. Whether the AlGaAs-based semiconductor laser LD1 or the AlGaInP-based semiconductor laser LD2 is driven is selected by, for example, switching an external switch.

As described above, the conventional integrated semiconductor laser device 100 has the 700 nm-band AlGaAs-based semiconductor laser LD1 and the 600 nm-band AlGaInP-based semiconductor laser LD2 on the same substrate. Accordingly, laser light for DVDs and laser light for CDs can be independently obtained. Playing and recording of both DVDs and CDs is therefore enabled by mounting the integrated semiconductor laser device 100 as a laser light source on an optical pickup of a DVD device.

The respective laser structures of the AlGaAs-based semiconductor laser LD1 and the AlGaInP-based semiconductor laser LD2 are formed by semiconductor layers grown over the same n-type GaAs substrate 101. Therefore, only one package is required for this integrated semiconductor laser device. This enables reduction in size of an optical pickup and therefore reduction in size of a DVD device.

This conventional integrated semiconductor laser device 100 has an isolation groove 140 so that the AlGaInP-based semiconductor laser LD2 as a red semiconductor laser and the AlGaAs-based semiconductor laser LD1 as an infrared semiconductor laser have the same chip width. The isolation groove 140 is formed by etching or the like and electrically isolates a red semiconductor laser portion and an infrared semiconductor laser portion which are formed on the same substrate by crystal growth.

In general, a semiconductor laser has characteristics in that its optical output reduces with increase in temperature. It is therefore necessary to sufficiently release the heat generated by the semiconductor laser itself during driving of the semiconductor laser. In order to implement such sufficient heat release, a semiconductor laser is mounted junction-down on a high thermal-conductivity heat sink. It is obvious that the larger the contact area of the semiconductor laser with the heat sink is, the more the heat is released.

In a two-wavelength semiconductor laser device, however, two semiconductor lasers are electrically connected to each other if merely arranged side by side in contact with each other. In order to avoid such electric connection between the semiconductor lasers, it is necessary to form an isolation groove between the two semiconductor lasers. However, a two-wavelength semiconductor laser device having an isolation groove has the following problem. It is herein assumed that a two-wavelength semiconductor laser device having an isolation groove is fabricated with the same dimensions as those of a two-wavelength semiconductor laser device having two semiconductor lasers arranged side by side with no isolation groove. In this case, the heat release area of the two-wavelength semiconductor laser device having an isolation groove is smaller than that of the two-wavelength semiconductor laser device having no isolation groove by the area of the isolation groove. This is because the isolation groove cannot contribute to heat release. As a result, the heat release efficiency is degraded.

If the area of each semiconductor laser is increased to improve heat release, characteristics of the two-wavelength semiconductor laser, that is, reduction in size, will be lost.

In the case where an isolation groove is provided to reduce the heat release area, the resultant degradation in heat release efficiency occurs significantly in a red laser. This is because the step ($\Delta Ec$) of the conduction band energy at the interface between an active layer and a p-type cladding layer is smaller in a red semiconductor laser than in an infrared semiconductor laser. In other words, since $\Delta Ec$ is small, the red semiconductor laser is more susceptible to carrier overflow, that is, a phenomenon in which carriers injected into an active layer are thermally excited and overflow into a p-type cladding layer. As a result, in the red semiconductor laser, saturation of the highest optical output due to thermal saturation is more likely to occur during high temperature operation, as compared to the infrared semiconductor laser.

In order to record DVDs at a 16-fold speed or higher, high output of at least 350 mW is required at a high temperature of 85° C. Such optical output saturation due to thermal saturation therefore causes critical problems.

In a semiconductor laser device disclosed in Japanese Patent Laid-Open Publication No. 2002-190649 (hereinafter, referred to as Document 2), an isolation groove is positioned so that each semiconductor laser has a different electric connection area with another device.

Figure 10:
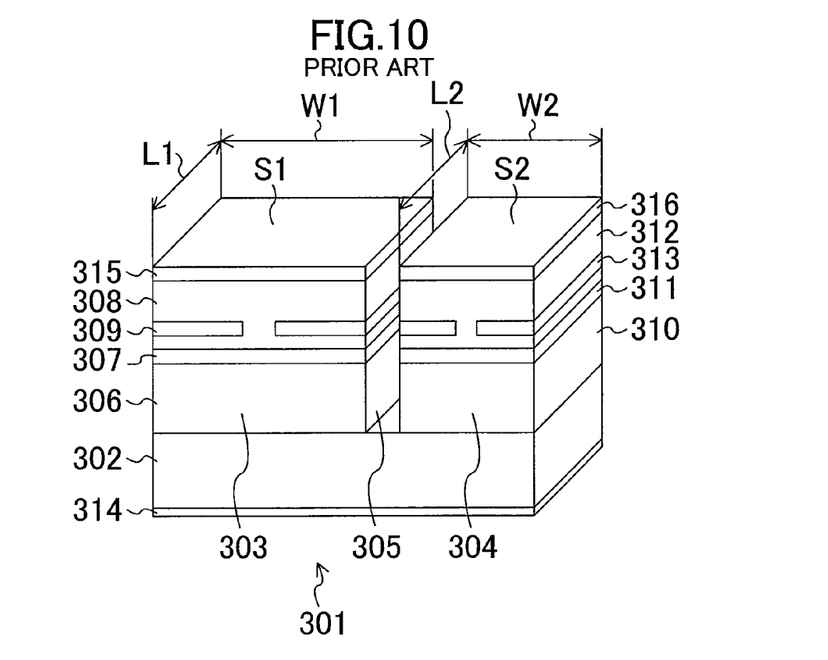
FIG. 10 shows another example of a two-wavelength semiconductor laser of related art.

An example of such a two-wavelength semiconductor laser device is shown in FIG. 10. A semiconductor laser device 301 of FIG. 10 includes a 650 nm-band red semiconductor laser (first semiconductor laser) 303 and a 780 nm-band infrared semiconductor laser (second semiconductor laser) 304 on the same n-type GaAs substrate 302. The red semiconductor laser 303 is made of an AlGaInP-based material and the infrared semiconductor laser 304 is made of a GaAs-based material. An isolation groove 305 is provided between the red semiconductor laser 303 and the infrared semiconductor laser 304.

Note that, in the red semiconductor laser 303, an n-type AlGaInP cladding layer 306, an active layer 307, and a p-type AlGaInP cladding layer 308 are sequentially formed on the n-type GaAs substrate 302. The active layer 307 is made of AlGaInP and GaInP and has a multiple quantum well structure. An n-type AlInP (aluminum indium phosphide) current block layer 309 is formed in the p-type AlGaInP cladding layer 308 so as to form a stripe-shaped current path. A structure for confining a current injected into the active layer 307 is thus formed.

A p-type electrode 315 is formed on the cladding layer 308. The p-type electrode 315 is connected to a heat sink (heat dissipating member). The contact area of the p-type electrode 315 with the heat sink is S1 (=cavity length L1×width W1).

In the infrared semiconductor laser 304, an n-type AlGaAs cladding layer 310, an active layer 311, and a p-type AlGaAs cladding layer 312 are sequentially formed on the substrate 302. The active layer 307 is made of AlGaAs and GaAs and has a multiple quantum well structure. An n-type AlGaAs current block layer 313 is formed in the p-type AlGaAs cladding layer 312 so as to form a stripe-shaped current path. A structure for confining a current injected into the active layer 311 is thus formed.

A p-type electrode 316 is formed on the cladding layer 312. The p-type electrode 316 is connected to a heat sink. The contact area of the p-type electrode 316 with the heat sink is S2 (=cavity length L2×width W2). Note that L1=L2.

In the semiconductor laser device 301 described above, the red semiconductor laser 303, which is smaller in thermal conductivity of the p-type cladding layer and $\Delta Ec$ than the infrared semiconductor laser 304, has a wider chip width W1 than a chip width W2 of the infrared semiconductor laser 304. Since the respective cavity lengths L1 and L2 of the red semiconductor laser 303 and the infrared semiconductor laser 304 are equal to each other, the respective contact areas with the heat sink, that is, the respective areas contributing to heat release, have the relation S1>S2. Accordingly, excellent temperature characteristics can be implemented both in the red semiconductor laser 303 and the infrared semiconductor laser 304.

SUMMARY

It is of course desirable to reduce the manufacturing cost of a semiconductor laser element. In order to implement reduction in manufacturing cost, it is effective to reduce the size (area) per element. This is because the number of elements that can be manufactured from a wafer is increased as the element size becomes smaller.

The size of a semiconductor laser element is determined by the cavity length and the width (the dimension in the direction perpendicular to the cavity-length direction and in parallel with a substrate) of the element.

The cavity length is an important parameter that determines the density of carriers to be injected into an active layer, cavity loss, and the like, and directly affects an oscillation threshold current value, external differential quantum efficiency, an operating current value, and the like. In general, the longer the cavity length is, the smaller the operating carrier density becomes. As a result, carrier overflow can be reduced in high temperature operation, enabling laser oscillation at a higher temperature. The cavity length thus significantly affects implementation of desired high-temperature high-power operation and therefore needs to be determined with higher priority over the element width.

The element width, on the other hand, relates to the hear release area of the heat generated in the element during operation. However, the element width affects high temperature characteristics less than the cavity length does. During operation of the element, heat is generated in a current injection region and a region in the vicinity thereof. The heat generated in this heat generating region spreads in a region of several tens of micrometers on both sides of a current injection stripe. If the width of the semiconductor laser element is wider than that of the heat spreading region, the area of the element is considered to be large enough in terms of the heat release capability. The width of the element therefore affects the high temperature characteristics less than the cavity length does.

Accordingly, in order to reduce the manufacturing cost of a two-wavelength laser, it is extremely effective to reduce the element width as much as possible in such a range that can assure the high temperature characteristics of both a red laser and an infrared laser with the same cavity length.

However, it was found that a two-wavelength laser device mounted junction-down on a heat sink material has the following problem if the element width is excessively reduced. When the element width is excessively reduced, optical output is reduced, whereby the signal amount is reduced and the SN (Signal-to-Noise) ratio is reduced. This is a critical problem in practical applications.

Note that Document 2 merely discloses that an infrared laser which is advantageous in terms of temperature characteristics has a smaller width than that of a red laser, and does not disclose that optical output is reduced by reducing the width of a laser element.

In view of the above, a two-wavelength semiconductor laser device integrating a red laser and an infrared laser on the same substrate, capable of emitting light at respective wavelengths, capable of being manufactured at lower manufacturing cost, and having excellent high temperature characteristics and high power in both a red laser and an infrared laser will now be described.

The inventors of the present application examined the reason why optical output is reduced by reducing the width of a laser element. As a result, the inventors found that the polarization ratio (the ratio of the TE (Transverse Electric) mode intensity to the TM (Transverse Magnetic) mode intensity) is reduced when the width of the laser element is excessively reduced. In general, a polarization beam splitter is used as an element of an optical system of an optical pickup. Accordingly, as the polarization ratio is reduced, optical output is reduced. As a result, the signal amount is reduced, causing reduction in SN ratio.

The inventors of the present application also found that when the width of a laser element is excessively reduced, stress is generated in respective current-injection stripe portions of a red laser and an infrared laser, thereby causing reduction in polarization ratio. In the case where a laser device is mounted junction-down on a heat sink material, this stress is generated when the temperature is reduced from a high temperature required to melt a solder material in a mounting process to the room temperature. In other words, the stress is generated due to the difference in thermal expansion coefficient between a material of the laser element and the heat sink material.

Based on the above new findings, a semiconductor laser device of the present disclosure is a semiconductor laser device in which a red semiconductor laser element and an infrared semiconductor laser element are integrated on a same substrate. The red semiconductor laser element has a double hetero structure in which a red-side active layer made of an InGaP-based or AlGaInP-based material is interposed between a red-side first conductivity type cladding layer and a red-side second conductivity type cladding layer having a ridge for current injection. The infrared semiconductor laser element has a double hetero structure in which an infrared-side active layer made of a GaAs-based or AlGaAs-based material is interposed between an infrared-side first conductivity type cladding layer and an infrared-side second conductivity type cladding layer having a ridge for current injection. Provided that a first electrode formed over the red-side second conductivity type cladding layer has a width $W1$ in a direction perpendicular to a cavity length direction and a second electrode formed over the infrared-side second conductivity type cladding layer has a width $W2$ in a direction perpendicular to a cavity length direction, the relations of $W1 > W2$ and $80\ \mu m \geq W2 \geq 60\ \mu m$ are satisfied.

In the semiconductor laser device of the present disclosure, the width of the red semiconductor laser element including the red-side active layer made of an InGaP-based or AlGaInP-based material ($W1$; the dimension of the first electrode in the direction perpendicular to the cavity-length direction and in parallel with the substrate) is larger than the width of the infrared semiconductor laser element having the infrared-side active layer made of a GaAs-based or AlGaAs-based material ($W2$; the dimension of the second electrode in the direction perpendicular to the cavity-length direction and in parallel with the substrate).

Accordingly, when the semiconductor laser device is mounted junction-down on a heat sink, the red semiconductor laser element in which saturation of the highest optical output due to thermal saturation is more likely to occur during high temperature operation (than in the infrared semiconductor laser element) has a larger contact area with the heat sink so as to have higher heat release efficiency (than that of the infrared semiconductor laser element). Moreover, since the width $W2$ of the second electrode is smaller than the width $W1$ of the first electrode, increase in overall width of the semiconductor laser device is suppressed.

Moreover, the range of the width $W2$ of the second electrode ($80\ \mu m \geq W2 \geq 60\ \mu m$) is determined to ensure a desirable polarization ratio of the laser element.

Note that the red-side first conductivity type cladding layer, the red-side second conductivity type cladding layer, the infrared-side first conductivity type cladding layer, and the infrared-side second conductivity type cladding layer may be made of an AlGaInP-based material.

The red-side first conductivity type cladding layer, the red-side second conductivity type cladding layer, and the infrared-side second conductivity type cladding layer may be made of an AlGaInP-based material, and the infrared-side first conductivity type cladding layer may be made of an AlGaAs-based material.

Such materials can be used for each cladding layer.

Preferably, the relation of $90\ \mu m \geq W1 \geq 70\ \mu m$ is further satisfied.

This range of the width $W1$ of the first electrode is desirable in order to reduce the element area of the red semiconductor laser element without causing degradation in heat release capability and polarization characteristics.

Preferably, the semiconductor laser device is mounted by connecting the first electrode and the second electrode to a submount made of AlN, Si, or SiC.

In other words, it is preferable that the semiconductor laser device is mounted in a so-called "junction-down" manner, that is, in such a manner that surface closer to the red-side active layer and the infrared-side active layer is bonded to the submount. The submount serving as a heat sink may be made of AlN, Si, or SiC.

With the above structure, the element width of the semiconductor laser device can be reduced while maintaining a high polarization ratio and excellent high temperature operation characteristics in both the red semiconductor laser element and the infrared semiconductor laser element.

As has been described above, according to the semiconductor laser device of the present disclosure, by setting the respective widths of the red semiconductor laser element and the infrared semiconductor laser element, the element area can be reduced while maintaining excellent temperature characteristics and a high polarization ratio in both the red semiconductor laser element and the infrared semiconductor laser element. As a result, a small, high power semiconductor laser device can be implemented.

DETAILED DESCRIPTION

First Embodiment

Hereinafter, an example semiconductor device of a first embodiment will be described with reference to the accompanying drawings.

Figure 1A:
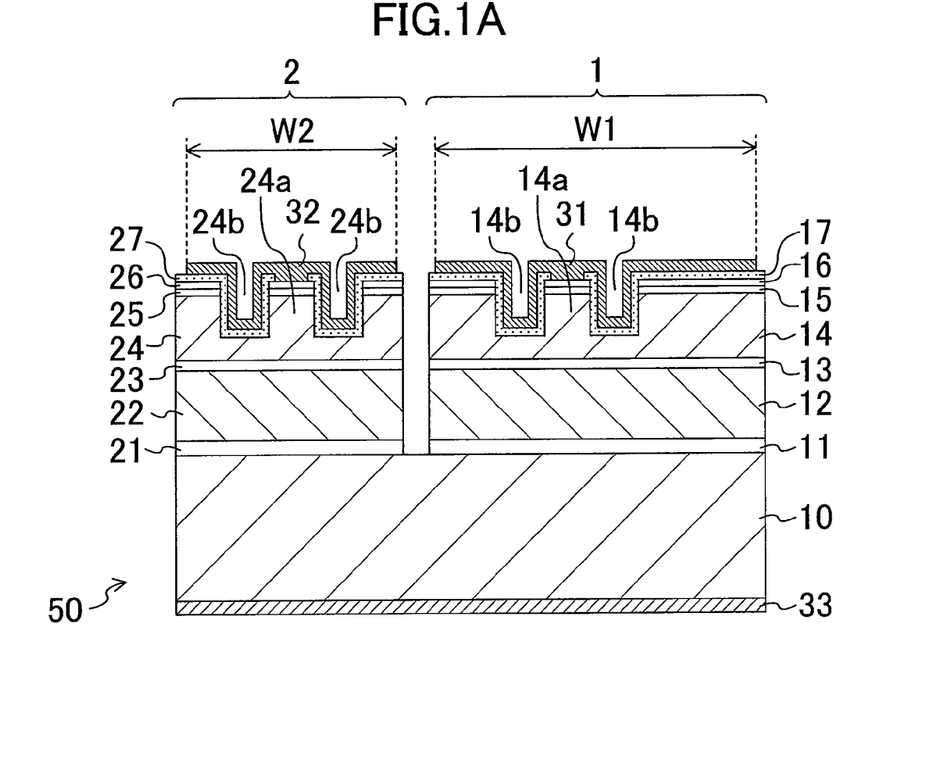
FIG. 1A is a schematic cross-sectional view of an example semiconductor laser device of a first embodiment.

FIG. 1A schematically shows a cross-sectional structure of an example semiconductor laser device 50.

The semiconductor laser device 50 is a semiconductor laser device capable of emitting light at a plurality of wavelengths (two wavelengths in this example). In the semiconductor laser device 50, a red laser 1 and an infrared laser 2 are integrated on an n-type GaAs substrate 10 as two light emitting portions for emitting light at different wavelengths from each other. The n-type GaAs substrate 10 has a surface tilted at 10 degrees from a (100) face in a [011] direction as a main surface. Note that an electrode 33 is formed on the back surface (the surface located on the opposite side to the red laser 1 and the like) of the n-type GaAs substrate 10.

First, the structure of the red laser 1 will be described. In the red laser 1, an n-type buffer layer 11 (thickness: 0.5 µm), an n-type cladding layer 12 (thickness: 2.0 µm), an active layer 13, a p-type cladding layer 14, a p-type protective layer 15 (thickness: 50 nm), and a p-type contact layer 16 (thickness: 0.4 µm) are sequentially formed on the n-type GaAs substrate 10 in this order from the bottom. The n-type buffer layer 11 is made of n-type GaAs, and the n-type cladding layer 12 is made of n-type $(Al_{0.7}Ga_{0.3})_{0.51}In_{0.49}P$. The active layer 13 has a strained quantum well structure. The p-type cladding layer 14 is made of p-type $(Al_{0.7}Ga_{0.3})_{0.51}In_{0.49}P$, the p-type protective layer 15 is made of p-type $Ga_{0.51}In_{0.49}P$, and the p-type contact layer 16 is made of p-type GaAs.

The p-type cladding layer 14 has two groove portions 14b and a ridge portion 14a between the groove portions 14b. The p-type protective layer 15 and the p-type contact layer 16 are formed over the p-type cladding layer 14 (including over the ridge portion 14a) except for the groove portions 14b. A current block film 17 made of SiN (silicon nitride) is formed so as to cover the p-type contact layer 15 and the groove portions 14b. The current block film 17 covers the side surfaces of the ridge portion 14a and has an opening on top surface of the ridge portion 14a for current injection.

An electrode 31 is formed over the current block film 17 and the opening of the current block film 17 over the ridge portion 14a. A current for driving the red laser 1 can therefore be applied through the electrode 31 and the electrode 33 on the back surface of the n-type GaAs substrate 10.

Note that, in the p-type cladding layer 14, the distance from the upper end of the ridge portion 14a to the active layer 13 is 1.4 µm, and the distance dp1 from the lower end of the ridge portion 14a to the active layer 13 is 0.2 µm. The electrode 31 has a width W1 (the width in the direction perpendicular to the cavity-length direction of the red laser 1 and in parallel with the top surface of the n-type GaAs substrate 10).

Figure 1B:
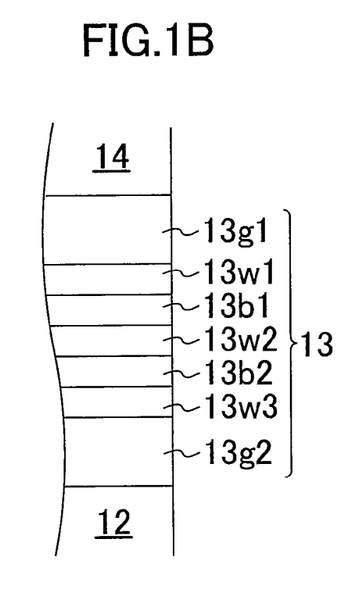
FIGS. 1B and 1C are diagrams showing the structure of an active layer in a red laser and an infrared laser of the example semiconductor laser device, respectively.

The active layer 13 is a strained quantum well active layer and has a structure shown in FIG. 1B. More specifically, the active layer 13 has a layered structure of three well layers 13w1, 13w2, and 13w3 (thickness of each well layer: 5 nm), two barrier layers 13b1 and 13b2 (thickness of each barrier layer: 5 nm), a first guide layer 13g1, and a second guide layer 13g2 (thickness of each guide layer: 50 nm). The well layers 13w1, 13w2, and 13w3 are made of GaInP, the barrier layers 13b1 and 13b2 are made of (AlGa)InP, and the first guide layer 13g1 and the second guide layer 13g2 are made of (AlGa)InP. The barrier layer 13b1 is interposed between the well layers 13w1 and 13w2, and the barrier layer 13b2 is interposed between the well layers 13w2 and 13w3. The first guide layer 13g1 and the second guide layer 13g2 are respectively formed over and under the five-layered structure of the well layers 13w1, 13w2, and 13w3 and the barrier layers 13b1 and 13b2 so that the five-layered structure is interposed between the first guide layer 13g1 and the second guide layer 13g2.

In this structure, a current injected from the p-type contact layer 16 is confined only in the ridge portion 14a by the current block film 17. The current is therefore injected intensively into the active layer 13 in a region under the ridge portion 14a. As a result, by injecting a current as small as about several tens of milliamperes, carriers can be brought into an inverted population state required for laser oscillation.

Light emitted by recombination of carriers injected into the active layer 13 is confined by the n-type cladding layer 12 and the p-type cladding layer 14 in a vertical direction to the active layer 13. At the same time, the light is confined in a horizontal direction to the active layer 13 because the current block film 17 has a lower refractive index than that of the n-type cladding layer 12 and the p-type cladding layer 14.

The current block film 17 is transparent to laser oscillation light. No laser oscillation light is therefore absorbed in the current block film 15, whereby a low-loss waveguide can be implemented. The difference $\Delta n$ in effective refractive index between inside and outside of the stripe can be precisely controlled on the order of $10^{-3}$ by controlling the value dp1.

The red laser 1 is therefore a high power semiconductor laser capable of precisely controlling light distribution and having a low operating current.

The infrared laser 2 has the same structure as that of the red laser 1 except for the structure of the active layer and operates in the same manner as that of the red laser 1 except for the emission wavelength. The infrared laser 2 will now be described in detail.

In the infrared laser 2, an n-type buffer layer 21 (thickness: 0.5 μm), an n-type cladding layer 22 (thickness: 2.0 μm), an active layer 23, a p-type cladding layer 24, a p-type protective layer 25 (thickness: 50 nm), and a p-type contact layer 26 (thickness: 0.4 μm) are sequentially formed on the same n-type GaAs substrate 10 as that of the red laser 1 in this order from the bottom. The n-type buffer layer 21 is made of n-type GaAs, and the n-type cladding layer 22 is made of n-type $(Al_{0.7}Ga_{0.3})_{0.51}In_{0.49}P$. The active layer 23 has a quantum well structure. The p-type cladding layer 24 is made of p-type $(Al_{0.7}Ga_{0.3})_{0.51}In_{0.49}P$, the p-type protective layer 26 is made of p-type $Ga_{0.51}In_{0.49}P$, and the p-type contact layer 26 is made of p-type GaAs.

The p-type cladding layer 24 has two groove portions 24b and a ridge portion 24a between the groove portions 24b. The p-type protective layer 25 and the p-type contact layer 26 are formed over the p-type cladding layer 24 (including over the ridge portion 24a) except for the groove portions 24b. A current block film 27 made of SiN is formed so as to cover the p-type contact layer 26 and the groove portions 24b. The current block film 27 covers the side surfaces of the ridge portion 24a and has an opening on top surface of the ridge portion 24a for current injection.

An electrode 32 is formed over the current block film 27 and the opening of the current block film 27 over the ridge portion 24a. A current for driving the infrared laser 2 can therefore be applied through the electrode 32 and the electrode 33 on the back surface of the n-type GaAs substrate 10.

Note that, in the p-type cladding layer 24, the distance from the upper end of the ridge portion 24a to the active layer 23 is 1.4 μm, and the distance db2 from the lower end of the ridge portion 24a to the active layer 23 is 0.24 μm. The electrode 32 has a width W2 (the width in the direction perpendicular to the cavity-length direction of the red laser 1 and in parallel with the top surface of the n-type GaAs substrate 10).

Figure 1C:
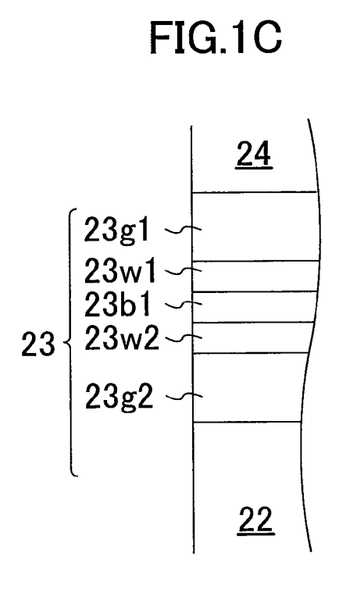

The active layer 23 is a quantum well active layer and has a structure shown in FIG. 1C. More specifically, the active layer 23 has a layered structure of two well layers 23w1 and 23w2, a barrier layer 23b1, a first guide layer 23g1, and a second guide layer 23g2. The well layers 23w1 and 23w2 are made of GaAs, the barrier layer 23b1 is made of AlGaAs, and the first guide layer 23g1 and the second guide layer 23g2 are made of AlGaAs. The barrier layer 23b1 is interposed between the well layers 23w1 and 23w2. The first guide layer 23g1 and the second guide layer 23g2 are respectively located over and under the three-layered structure of the well layers 23w1 and 23w2 and the barrier layer 23b1 so that the three-layered structure is interposed between the first guide layer 23g1 and the second guide layer 23g2.

In this structure as well, a current injected from the p-type contact layer 26 is confined only in the ridge portion 24a by the current block film 27, as in the red laser 1. The current is therefore injected intensively into the active layer 23 in a region under the ridge portion 24a. As a result, by injecting a current as small as about several tens of milliamperes, carriers can be brought into an inverted population required for laser oscillation.

Light emitted by recombination of carriers injected into the active layer 23 is confined in the same manner as that in the red laser 1. More specifically, the light is confined by the n-type cladding layer 22 and the p-type cladding layer 24 in the vertical direction to the active layer 23. At the same time, the light is confined in the horizontal direction to the active layer 23 because the current block film 27 has a lower refractive index than that of the n-type cladding layer 22 and the p-type cladding layer 24.

The current block film 27 is transparent to laser oscillation light. No laser oscillation light is therefore absorbed in the current block film 27 and a low-loss waveguide can be implemented. Moreover, as in the red laser 1, the difference $\Delta n$ in effective refractive index between inside and outside of the stripe can be precisely controlled on the order of $10^{-3}$ by controlling the value dp2.

The infrared laser 2 is therefore a high power semiconductor laser capable of precisely controlling light distribution and having a low operating current.

In order to improve the heat release capability in high temperature operation of, for example, 80° C., the operating current density is reduced by setting the cavity length to 1,500 μm or more in the case of a high power laser of 300 nm or higher. In this example, the cavity length is set to 1,700 μm both in the red laser 1 and the infrared laser 2.

In the red laser 1 and the infrared laser 2, dielectric film coating is performed so that the reflectance at the front facet of the cavity becomes 7% and the reflectance at the rear facet of the cavity becomes 94% for red laser light and infrared laser light, respectively.

Figure 2:
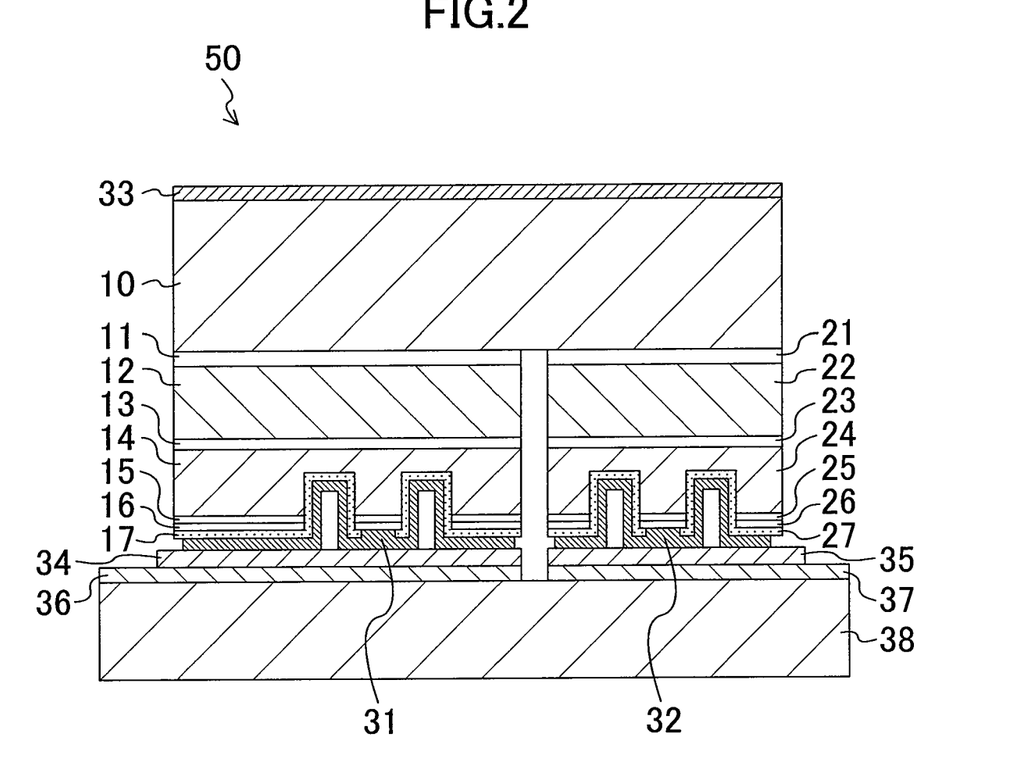
FIG. 2 shows a state in which the example semiconductor laser device of the first embodiment is mounted junction-down.

FIG. 2 shows a state in which the semiconductor laser device 50 of FIGS. 1A through 1C is mounted junction-down on a submount 38 serving as a heat sink. "Junction-down" herein refers to a structure in which the semiconductor laser device 50 is mounted so that the electrodes 31 and 32 which are located closer to the active layers 13 and 23 than the electrode 33 is face the heat sink side. Electrodes 36 and 37 are formed on the submount 38, and the electrodes 31 and 32 are respectively mounted on the electrodes 36 and 37 with solder layers 34 and 35 interposed therebetween. In this junction-down mounting, the distance between the submount 38 as a heat sink and the active layers 13 and 23 can be reduced to as small as several micrometers. Heat generated in the active layers 13 and 23 can therefore be efficiently released to the submount 38.

Heat generation in the active layers 13 and 23 occur in a light distribution region in the vicinity of the ridge portions 14a and 24a, and the heat thus generated is released to the submount 38 through the electrodes 31 and 32. Accordingly, the heat release capability of the red laser 1 and the infrared laser 2 is affected by the widths W1 and W2 of the electrodes 31 and 32, respectively. When the electrode width is small, the heat release capability is degraded. As a result, the heat resistance of the element is increased, causing increase in operating current value in high temperature operation.

However, if the electrode width is increased in order to improve the heat release capability, the area of the element is increased, thereby causing increase in manufacturing cost of the semiconductor laser device 50.

In relation to the above, the widths W1 and W2 of the electrodes 31 and 32 shown in FIG. 1A will now be described. Since the red laser 1 has the groove portions 14b, a part of the width W1, that is, a part corresponding to the groove portions 14b, is not in contact with the electrode 37 (the solder layer 35). However, the width of the groove portions 14b is sufficiently smaller than the width W1 of the electrode 31 and can be ignored. In the infrared laser 2 as well, the width of the groove portions 24b can be ignored when the width W2 of the electrode 32 is considered.

In this example, an AlGaInP-based cladding layer is used as the n-type cladding layers 12 and the p-type cladding layer 14 of the red laser 1, and a quantum well active layer made of GaInP and AlGaInP is used as the active layer 13 of the red laser 1. An AlGaInP cladding layer is used as the n-type cladding layer 22 and the p-type cladding layer 24 of the infrared laser 2 and a quantum well active layer made of AlGaAs and GaAs is used as the active layer 23 of the infrared laser 2.

As described above, carrier overflow is a phenomenon in which carriers injected in an active layer are thermally excited and overflow into a cladding layer. Regarding the carrier overflow, overflow of electrons (carriers having a lighter effective mass than that of holes) into a p-type cladding layer is dominant. In order to suppress such electron overflow, it is effective to increase the energy ($\Delta E_c$) of conduction band hetero barrier which is generated due to the bangap energy difference between the active layer and the p-type cladding layer.

In this example, an AlGaInP cladding layer is used in both the red laser 1 and the infrared laser 2. Therefore, $\Delta E_c$ in the infrared laser 2 having the active layer 23 made of an AlGaAs-based material is several hundreds of milli-electron-volts higher than $\Delta E_c$ of the red laser 1 having the active layer 13 made of an AlGaInP-based material.

Therefore, as compared to the red laser 1, the infrared laser 2 can suppress generation of carrier overflow even in high temperature operation and is less likely to cause reduction in optical output. As described above, the heat release capability depends on the electrode width. Therefore, provided that the semiconductor laser device 50 has a fixed overall width, excellent high temperature characteristics can be obtained in both the red laser 1 and the infrared laser 2 by making the electrode width W1 of the red laser 1 wider than the electrode width W2 of the infrared laser 2.

First, the electrode width W1 of the red laser 1 will now be described. As shown in FIG. 1A, the width W1 of the electrode 31 needs to be narrower than the width of the red laser 1 at least by a margin required for an element manufacturing process. For example, this margin is a margin provided for mask accuracy, etching accuracy, and the like. If the width W1 of the electrode 31 is excessively reduced, however, the heat release area is reduced, thereby causing increase in heat resistance of the element. Accordingly, in the semiconductor laser device 1 of FIG. 1A, the distance $\Delta W$ from the end of the red laser 1 to the end of the electrode 31 is set to 5 μm to 15 μm. In this example, $\Delta W$ is set to 10 μm. Since the margin $\Delta W$ is provided at both ends, the width of the red laser 1 is larger than the width W1 of the electrode 31 by twice $\Delta W$ ($\Delta W \times 2$).

Figure 3A:
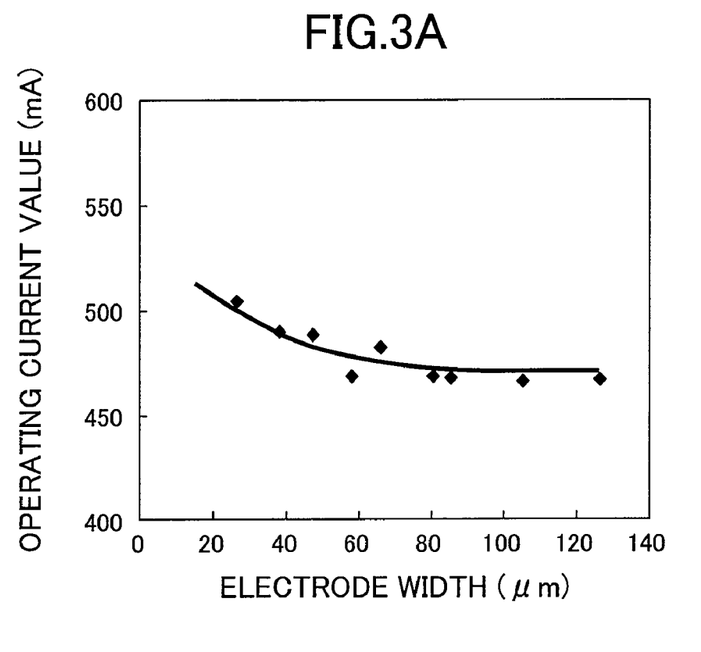
FIGS. 3A and 3B show the measurement results of electrode-width dependency of the operating current value of the red laser and the infrared laser in the first embodiment, respectively.

FIG. 3A is a graph showing the operating current value of the red laser 1 measured by varying the electrode width W1 with the cavity length of 1,500 μm and $\Delta W$ of 10 μm. The semiconductor laser device was operated at 85° C., a pulse width of 50 ns, and a duty ratio of 33% with optical output of 300 mW. As shown in FIG. 3A, in the red laser 1, the operating current value increases when the electrode width W1 becomes smaller than 70 μm. The reason for this is considered as follows: as the electrode width W1 is reduced, the heat release capability is degraded, whereby the heat resistance is increased. As a result, high temperature characteristics are degraded, whereby the operating current value is increased.

It can be seen from FIG. 3 that the electrode width W1 of the red laser 1 needs to be at least 70 μm in order to prevent degradation in high temperature characteristics due to increase in heat resistance. However, if the electrode width W1 is excessively increased, the overall area of the semiconductor laser device 50 is increased, causing increase in manufacturing cost of the semiconductor laser device 50. Accordingly, in order to retain excellent heat release capability of the red laser 1 while reducing the element area as much as possible, it is preferable to fabricate the red laser 1 with the electrode width W1 of 70 μm to 90 μm. In this example, W1 is set to 80 μm.

The electrode width W2 of the infrared laser 2 will now be described. As shown in FIG. 1A, the width W2 of the electrode 32 needs to be narrower than the width of the infrared laser 2 at least by a margin required to manufacture the element, as in the case of the red laser 1. However, if the electrode width W2 is excessively reduced, the heat release area is reduced and the heat resistance of the element is increased. Accordingly, in the semiconductor laser device 50 shown in FIG. 1A, the difference $\Delta W$ between the width of the infrared laser 2 and the width W2 of the electrode 32 is set to 5 μm to 15 μm. In this example, $\Delta W$ is set to 10 μm.

Figure 3B:
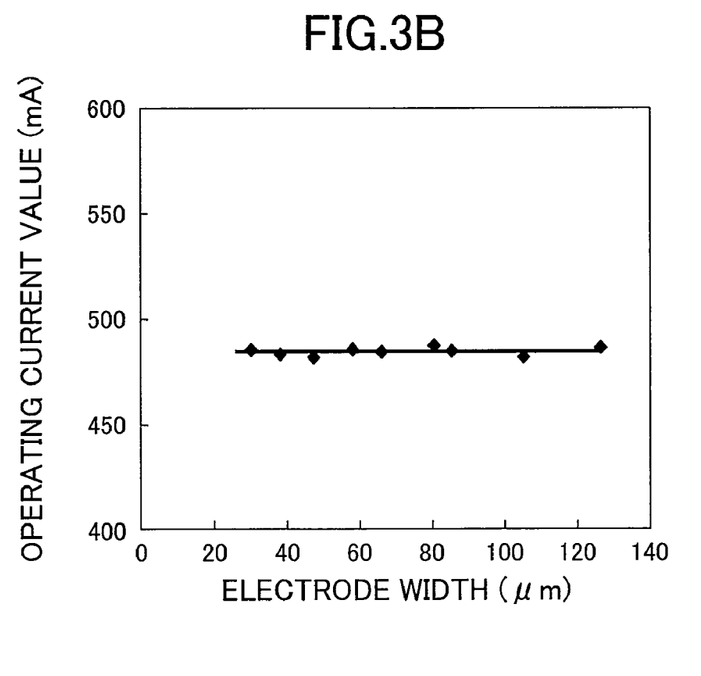

FIG. 3B is a graph showing the operating current value of the infrared laser 2 measured by varying the electrode width W2 with the cavity length of 1,500 μm and $\Delta W$ of 10 μm. The semiconductor laser device was operated at 85° C., a pulse width of 100 ns, and a duty ratio of 50% with optical output of 350 mW. As shown in FIG. 3B, in the infrared laser 2 of this example, the operating current value does not change although the electrode width W1 is reduced from 130 μm to 30 μm. The reason for this is considered as follows: as the electrode width W2 is reduced, the heat release capability is degraded, whereby the operating temperature of the element increases. However, since an AlGaInP cladding layer is used as the p-type cladding layer, $\Delta E_c$ is large, whereby carrier overflow suppressed. It can therefore be considered that the electrode width W2 can be reduced to as narrow as 30 μm without causing increase in operating current in high temperature operation (degradation in high temperature characteristics) due to degradation in heat release capability.

However, since the submount 38 and the GaAs substrate 10 have different thermal expansion coefficients from each other, stress is generated after mounting of the semiconductor laser device 50 due to the temperature difference between a high temperature state during a solder mounting process and a room temperature state after the mounting process. When such stress is generated, the refractive index of the semiconductor material is varied, thereby causing anisotropy of the refractive index. As a result, the polarization ratio is reduced.

Figure 4:
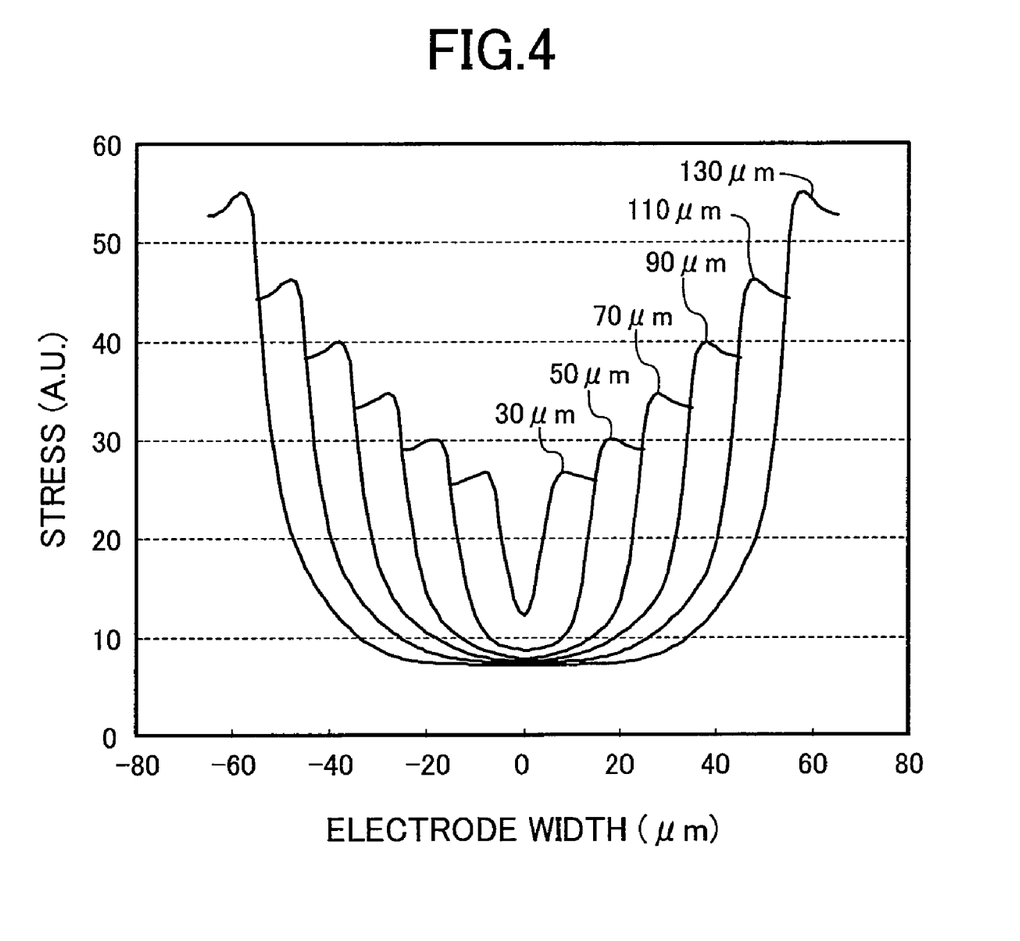
FIG. 4 shows the calculation result of electrode-width dependency of stress distribution generated in the active layer in the first embodiment.

FIG. 4 shows the calculation result of stress distribution in the active layer. In this case, the electrode width was set to 30 μm to 130 μm and the semiconductor laser device was mounted at 350° C. by using an AlN (aluminum nitride) sub-mount having an AuSn (gold-tin) solder pattern thereon. The abscissa indicates the position, where the center of the electrode in the width direction is 0, one direction of the width direction is positive, and the other direction of the width direction is negative.

It can be seen from FIG. 4 that, when the electrode width is 30 μm, 50 μm, 70 μm, 90 μm, 110 μm, and 130 μm, stress is the largest in the vicinity of both ends of the electrode. The reason for this will now be described.

When the semiconductor laser device 50 is mounted junction-down as shown in FIG. 2, the electrode portion (31 or 32) is bonded to the submount (34 or 35) by the solder material. In this case, since the material of the submount (34 or 35) and the material of the laser element have different thermal expansion coefficients from each other, stress corresponding to the temperature difference between the melting point of the solder material and the room temperature is generated in the active layer (13 or 23) in the vicinity of the ridge (14a or 24a).

A region in the vicinity of the electrode ends is a boundary region between a region where the electrode is fixed by solder and a region where the electrode is not fixed by solder. Therefore, the laser element is likely to be deformed in this region, and stress generated in the active layer becomes the largest in this region. When stress is generated, anisotropy of the refractive index is caused in the cladding layer of the laser element, causing reduction in polarization ratio. It is considered that, when the electrode width is reduced, the largest stress region in the vicinity of the electrode ends becomes closer to the ridge as shown in FIG. 4, whereby the polarization ratio is reduced.

Figure 5:
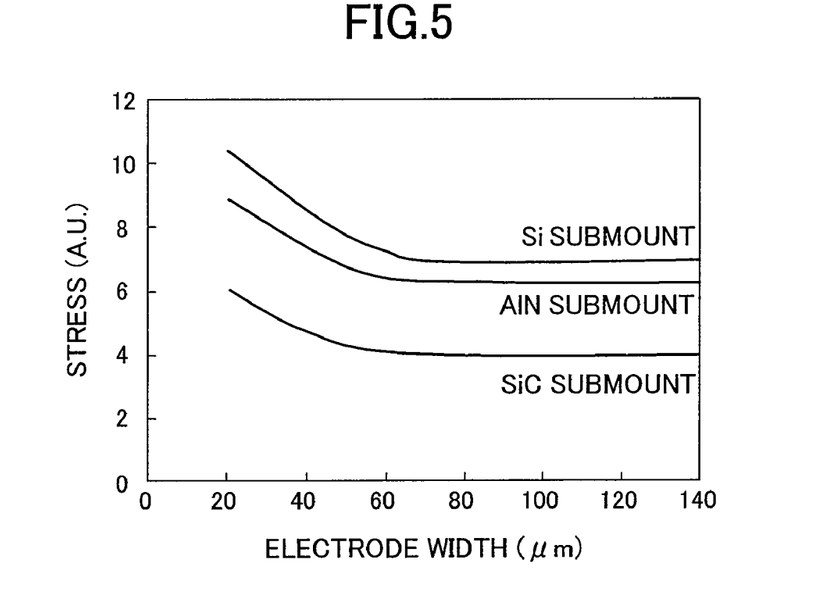
FIG. 5 shows the calculation result of electrode-width dependency of stress generated in the active layer when different mounts are used.

FIG. 5 shows the relation between the electrode width (W2) and the polarization ratio of the infrared laser 2. More specifically, FIG. 5 shows the calculation result of the stress generated in the active layer in the vicinity of the middle of the ridge. In this case, the submount was made of Si (silicon), SiC (silicon carbide), or AlN, AuSn was used as a solder material, and the temperature was cooled down to the room temperature after mounting at 350° C. It can be seen from FIG. 5 that the stress generated in the active layer in the vicinity of the ridge increases when the electrode width is narrower than about 55 μm in the SiC submount and when the electrode width is narrower than about 60 μm in the Si submount or the AlN submount. The respective thermal expansion coefficients of GaAs, Si, AlN, and SiC are $6\times10^{-6}$/K, $2.6\times10^{-6}$/K, $3\times10^{-6}$/K, and $4.7\times10^{-6}$/K. In the case of the SiC submount, the stress starts to increase at a narrower electrode width than in the case of the other sub-mount materials. This is considered to be because the thermal expansion coefficient of SiC is the closest to that of GaAs and the stress generated in the vicinity of the electrode ends is relatively smaller in the case of the SiC submount than in the case of the other sub-mount materials.

Figure 6:
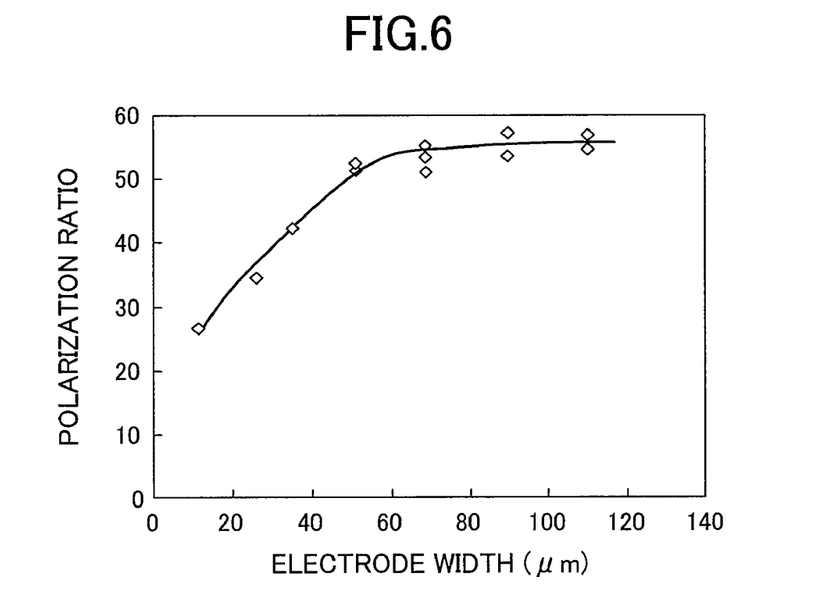
FIG. 6 shows the measurement result of electrode-width dependency of the polarization ratio of the infrared laser in the first embodiment.

FIG. 6 shows the electrode width dependency of the polarization ratio of the infrared laser during CW (Continuous Wave) operation at room temperature with output power of 3 mW. In this case, AlN was used as a submount material, AuSn was used as a solder material, and the semiconductor laser device was mounted at 350° C. It can be seen from FIG. 6 that the polarization ratio is reduced when the electrode width is reduced to about 60 μm or less.

In view of the above, in order to reduce the element width as much as possible and obtain both excellent temperature characteristics and excellent polarization characteristics in the infrared laser 2 of this example, the electrode width W2 is set to 70±10 μm in consideration of the margin for an element manufacturing process in the case of a Si, SiC or AlN submount. For example, the electrode width W2 is set to 70 μm.

The above relation between the stress and the electrode width applies not only to the infrared laser 2 but to the red laser 1. This is because the red laser 1 is made of the same materials as those of the infrared laser 2 except for the active layer formed by an ultrathin film layer. In other words, stress is more likely to be affected by a layer having a larger thickness. In this example, the GaAs substrate 10 has a relatively large thickness of about 100 μm, whereas the AlGaInP cladding layer has a thickness of several micrometers and the active layer is formed by an ultrathin film layer having a thickness of about 10 nm. Therefore, the influence of the GaAs substrate 10 on the stress is significantly larger than that of the AlGaInP cladding layer and the active layer. Since the red laser 1 and the infrared laser 2 have the same structure except for the active layers 13 and 23, the red laser 1 and the infrared laser 2 are considered to have the same stress-electrode width relation.

Accordingly, in the case where Si, SiC, or AlN is used as a submount material in the red laser 1, the width W1 of the electrode 31 needs to be at least about 60 μm in order to prevent reduction in polarization ratio. It should be noted that the red laser 1 has a smaller $\Delta Ec$ than that of the infrared laser 2 and has inferior temperature characteristics to those of the infrared laser 2. Accordingly, in order to reduce the element area as much as possible without causing degradation in heat release capability and reduction in polarization ratio, it is desirable to set the electrode width W1 to 70 μm to 90 μm as shown in FIG. 3A. In this example, W1 is set to 80 μm.

In this example, the ridge portions 14a, 24a are formed by forming the groove portions 14b, 24b. As in the semiconductor laser device of related art shown in FIG. 9, however, the cladding layer may alternatively have a reduced thickness except for the ridge portion, and the current block layer may have an increased thickness instead. The same effects as those described above can be obtained in such a semiconductor laser device by setting the respective widths of the electrodes 31, 32.

Second Embodiment

Hereinafter, an example semiconductor laser device according to a second embodiment will be described with reference to the figures. The semiconductor laser device 51 of FIG. 7 has the same structure as that of the semiconductor laser device 50 of the first embodiment shown in FIGS. 1A through 1C except for the points described below.

The semiconductor laser device 51 of this example is also a semiconductor laser device integrating a red laser 1 and an infrared laser 2 on an n-type GaAs substrate 1 as shown in FIG. 1A. The red laser 1 has the same structure as that of the first embodiment.

In the infrared laser 2 of the first embodiment, the n-type cladding layer 22 is made of $(Al_{0.7}Ga_{0.3})_{0.51}In_{0.49}P$. In the semiconductor laser device 51 of FIG. 7, on the other hand, an n-type cladding layer 40 is made of n-type $Al_{0.75}Ga_{0.25}As$.

Figure 7:
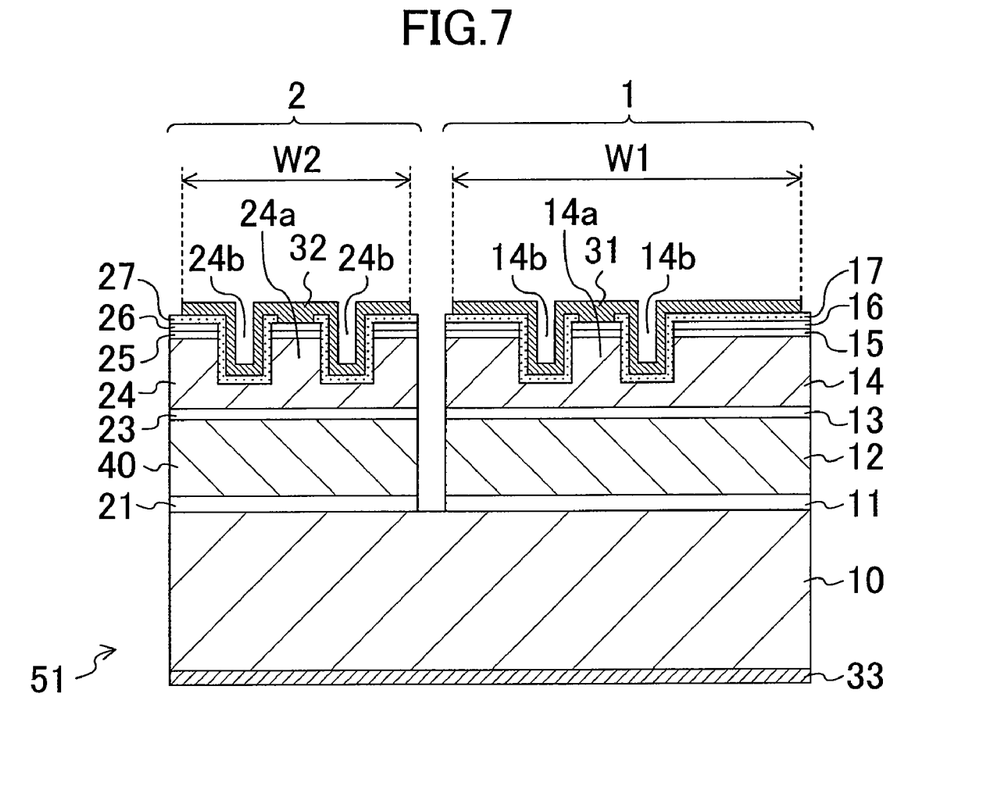
FIG. 7 is a schematic cross-sectional view of a semiconductor laser of a second embodiment.

In the p-type cladding layer 24 of the infrared laser 2 of the first embodiment, the distance dp2 from the lower end of the ridge portion 24a to the active layer 23 is 0.24 μm. In this embodiment, on the other hand, the distance dp2 is 0.26 μm.

Since the semiconductor laser device 51 of the second embodiment is otherwise the same as the semiconductor laser device 50 of the first embodiment, detailed description thereof will be omitted.

Note that the active layers 13 and 23 have the same quantum well structure as that shown in FIGS. 1B and 1C, respectively. In the semiconductor laser device 51 of the second embodiment as well, the width W1 of the electrode 31 is set to 80 μm and the width W2 of the electrode 32 is set to 70 μm.

A factor that determines temperature characteristics of the infrared laser 2 is electron overflow from the active layer 23 into the p-type cladding layer 24. Such electron overflow is determined by ΔEc. ΔEc is determined by the active layer 23 and the p-type cladding layer 24. Accordingly, even when the n-type cladding layer 40 is made of an AlGaAs-based material instead of an AlGaInP-based material, excellent temperature characteristics can be implemented without affecting electron overflow.

As in the case of the first embodiment, excellent temperature characteristics can be implemented even when the width W2 of the electrode 32 of the infrared laser 2 is reduced to as narrow as about 20 μm. In order to avoid degradation in polarization characteristics, the width W2 of the electrode 32 can be set to 60 μm or higher. Accordingly, the width W2 of the electrode 32 can be set to 70±10 μm in order to reduce the area of the infrared laser 2 as much as possible while maintaining excellent temperature characteristics and a high polarization ratio.

Regarding the red laser 1 as well, by setting the width W1 of the electrode 31 to 80±10 μm, the area of the red laser 1 can be reduced as much as possible while maintaining excellent temperature characteristics and a high polarization ratio, as in the case of the first embodiment.

Figure 8A:
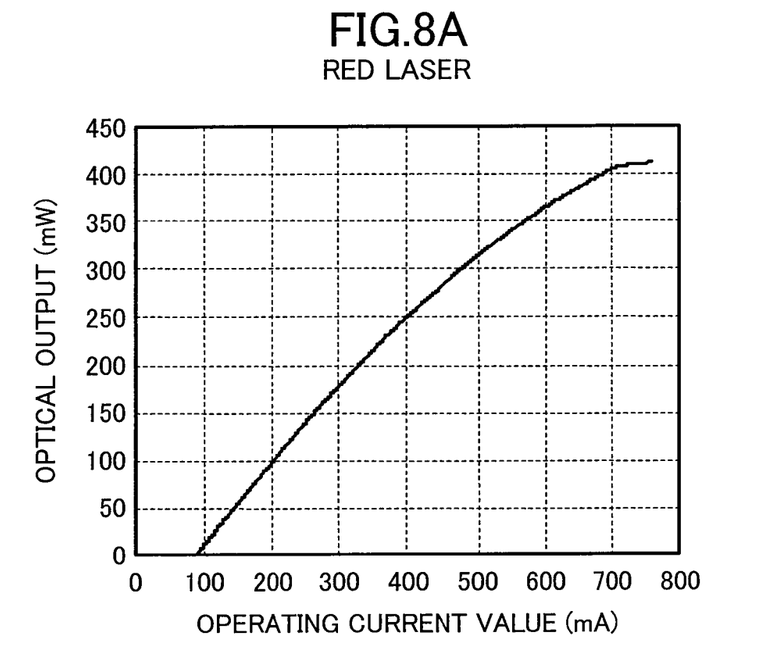
FIGS. 8A and 8B show the measurement results of current-optical output characteristics of the red laser and the infrared laser in the first and second embodiments when the semiconductor laser device is operated at 85° C., a pulse width of 50 ns, and a pulse duty ratio of 33%, respectively.
Figure 8B:
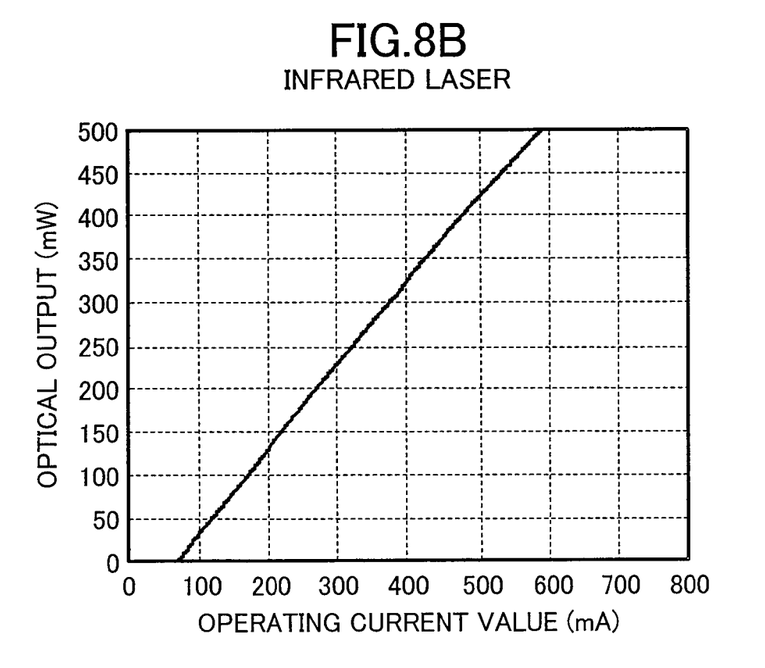

FIGS. 8A and 8B respectively show current-optical output characteristics of the red laser 1 and the infrared laser 2 when the semiconductor laser device is operated at 85° C., a pulse width of 50 ns, and a pulse duty ratio of 33%. In the red laser 1, no kink is generated until optical output reaches 400 mW. In the infrared laser 2, the current-optical output characteristics have extremely good linearity, and the kink level is 500 mW or higher. The same characteristics are obtained in both the first and second embodiments.

What is claimed is:

1. A semiconductor laser device, comprising:
a red semiconductor laser element; and
an infrared semiconductor laser element,
wherein the red semiconductor laser element and the infrared semiconductor laser element are integrated on a same substrate,
the red semiconductor laser element has a double hetero structure in which a red-side active layer made of an InGaP-based or AlGaInP-based material is interposed between a red-side first conductivity type cladding layer and a red-side second conductivity type cladding layer having a ridge for current injection,
the infrared semiconductor laser element has a double hetero structure in which an infrared-side active layer made of a GaAs-based or AlGaAs-based material is interposed between an infrared-side first conductivity type cladding layer and an infrared-side second conductivity type cladding layer having a ridge for current injection,
the red-side second conductivity type cladding layer, and the infrared-side second conductivity type cladding layer are made of an AlGaInP-based material,
where a first electrode formed over the red-side second conductivity type cladding layer has a width W1 in a direction perpendicular to a cavity length direction, a distance between an end of the infrared laser, and an end of a first electrode formed on the red-side second conductivity type cladding layer in a direction perpendicular to a cavity length direction is a distance ΔW1, a second electrode formed over the infrared-side second conductivity type cladding layer has a width W2 in a direction perpendicular to a cavity length direction, and a distance between the end of the red laser, and an end of a second electrode formed on the infrared-side second conductivity type cladding layer in a direction perpendicular to a cavity length direction is a distance ΔW2, the relations of W1>W2, 90 μm≧W1≧70 μm, 80 μm≧W2≧60 μm, 5 μm≧ΔW1≧15 μm, and 5 μm≧ΔW2≧15 μm are all satisfied, and
the first electrode and the second electrode are mounted on the semiconductor laser device by a connection to a submount made of AlN, Si, or SiC.

2. The semiconductor laser device of claim 1, wherein the red-side first conductivity type cladding layer, and the infrared-side first conductivity type cladding layer are made of an AlGaInP-based material.

3. The semiconductor laser device of claim 1, wherein the infrared-side first conductivity type cladding layer is made of an AlGaAs-based material.

* * * * *